(12) United States Patent
Ishikawa

(10) Patent No.: US 8,207,029 B2  
(45) Date of Patent: Jun. 26, 2012

(54) METHOD FOR MANUFACTURING SEMICONDUCTOR DEVICE

(75) Inventor: Masao Ishikawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 12/630,592

(22) Filed: Dec. 3, 2009

(65) Prior Publication Data

US 2010/0197129 A1    Aug. 5, 2010

(30) Foreign Application Priority Data

Feb. 2, 2009    (JP) .................................. 2009-021960

(51) Int. Cl.
*H01L 21/28*    (2006.01)

(52) U.S. Cl. ..... 438/197; 438/591; 438/243; 257/E21.21

(58) Field of Classification Search ................... 438/492, 438/591, 637, 689, 736, 243, 259, 261, 270, 438/386, 589, 268, 287, 586, 587, 478, 128
See application file for complete search history.

(56) References Cited

U.S. PATENT DOCUMENTS

| | | | |
|---|---|---|---|
| 5,308,778 A * | 5/1994 | Fitch et al. | 438/128 |
| 6,268,247 B1 * | 7/2001 | Cremonesi et al. | 438/258 |
| 7,821,058 B2 * | 10/2010 | Kidoh et al. | 257/324 |
| 7,983,084 B2 * | 7/2011 | Tokiwa et al. | 365/185.11 |
| 8,013,389 B2 * | 9/2011 | Oh et al. | 257/331 |
| 8,072,024 B2 * | 12/2011 | Ishikawa et al. | 257/324 |
| 2007/0252201 A1 * | 11/2007 | Kito et al. | 257/331 |
| 2008/0145998 A1 * | 6/2008 | Delgadino et al. | 438/401 |
| 2009/0283819 A1 | 11/2009 | Ishikawa et al. | |

FOREIGN PATENT DOCUMENTS

| | | |
|---|---|---|
| JP | 2006-237356 | 9/2006 |
| JP | 2007-266143 | 10/2007 |
| KR | 10-2005-0002076 | 1/2005 |

OTHER PUBLICATIONS

Notification of Comments issued by the Korean Patent Office on May 25, 2011, in Korean Patent Application No. 10-2010-8476, and English-language translation thereof.

Notification of Comments issued by the Korean Patent Office on Feb. 2, 2012, in Korean Patent Application No. 10-2010-8476, and English-language translation thereof.

* cited by examiner

*Primary Examiner* — Savitr Mulpuri

(74) *Attorney, Agent, or Firm* — Finnegan, Henderson, Farabow, Garrett & Dunner, L.L.P.

(57) ABSTRACT

A method for manufacturing a semiconductor device includes: forming a stacked body of a dielectric layer including a silicon oxide and a conductive layer including silicon above a substrate; and forming a hole penetrating through the dielectric layer and the conductive layer in the stacked body, the forming the hole including: forming a first mask layer including a silicon oxide above the stacked body; etching the conductive layer while using the first mask layer as a mask; and forming a second mask layer having more silicon content than the dielectric layer above the first mask layer to etch the dielectric layer while using the second mask layer as a mask.

18 Claims, 9 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-021960, filed on Feb. 2, 2009; the entire contents of which are incorporated herein by reference.

BACKGROUND OF THE INVENTION

1. Field of the Invention

The invention relates to a method for manufacturing a semiconductor device.

2. Background Art

Technology of forming three-dimensionally arranged memory cells, which includes creating through-holes from the uppermost layer to the bottom layer in a stacked structure in which a plurality of conductive layers function as word electrodes in a memory device and a plurality of dielectric layers are alternately stacked, forming a charge storage layer on the inner wall of the through-hole, and filling silicon into the through-hole in pillar shape, is proposed in, for example, JP-A 2007-266143 (Kokai).

When forming through-holes in a stacked structure of a plurality of conductive layers and a plurality of dielectric layers, it is necessary to alternately process (etch) the conductive layers and the dielectric layers. At this time, there may be a method in which the conductive layers are processed by forming a mask layer having an etching selection ratio to the conductive layers and using a processing apparatus for the conductive layers, and the dielectric layers are processed by forming a mask layer having an etching selection ratio to the dielectric layers and using a processing apparatus for the dielectric layers. However, the number of stacked conductive layers and dielectric layers are expected to increase in the future, and in this case, processing the conductive layers and the dielectric layers alternately by using separate processing apparatuses imposes a heavy burden of cost. Therefore, the hole formation is preferably performed collectively in a same chamber.

In the case where a mask layer of, for example, silicon oxide type is used when forming holes collectively, the mask layer has a sufficient etching selection ratio to silicon-based conductive layers. However, when etching dielectric layers of the same silicon oxide type, the mask layer is also etched to the same degree as the dielectric layers. The mask layer can be formed thick in anticipation of the degree of etching. Here, when the number of stacked conductive layers and dielectric layers further increases, the etching amount of the mask layer increases depending on the number of dielectric layers. Accordingly, the mask layer needs to be made thicker for the etching amount of the dielectric layers. However, the increase in the thickness of the mask layer imposes high aspect ratio to form pattern openings in the mask layer, and there is concern that the processing of the mask layer itself becomes difficult.

SUMMARY OF THE INVENTION

According to an aspect of the invention, there is provided a method for manufacturing a semiconductor device including: forming a stacked body of a dielectric layer including a silicon oxide and a conductive layer including silicon above a substrate; and forming a hole penetrating through the dielectric layer and the conductive layer in the stacked body, the forming the hole including: forming a first mask layer including a silicon oxide above the stacked body; etching the conductive layer while using the first mask layer as a mask; and forming a second mask layer having more silicon content than the dielectric layer above the first mask layer to etch the dielectric layer while using the second mask layer as a mask.

DETAILED DESCRIPTION OF THE INVENTION

A semiconductor device according to an embodiment of the invention includes: a memory cell array in which a plurality of memory cells are arranged three-dimensionally; and a peripheral circuit formed around the memory cell array.

Figure 1:
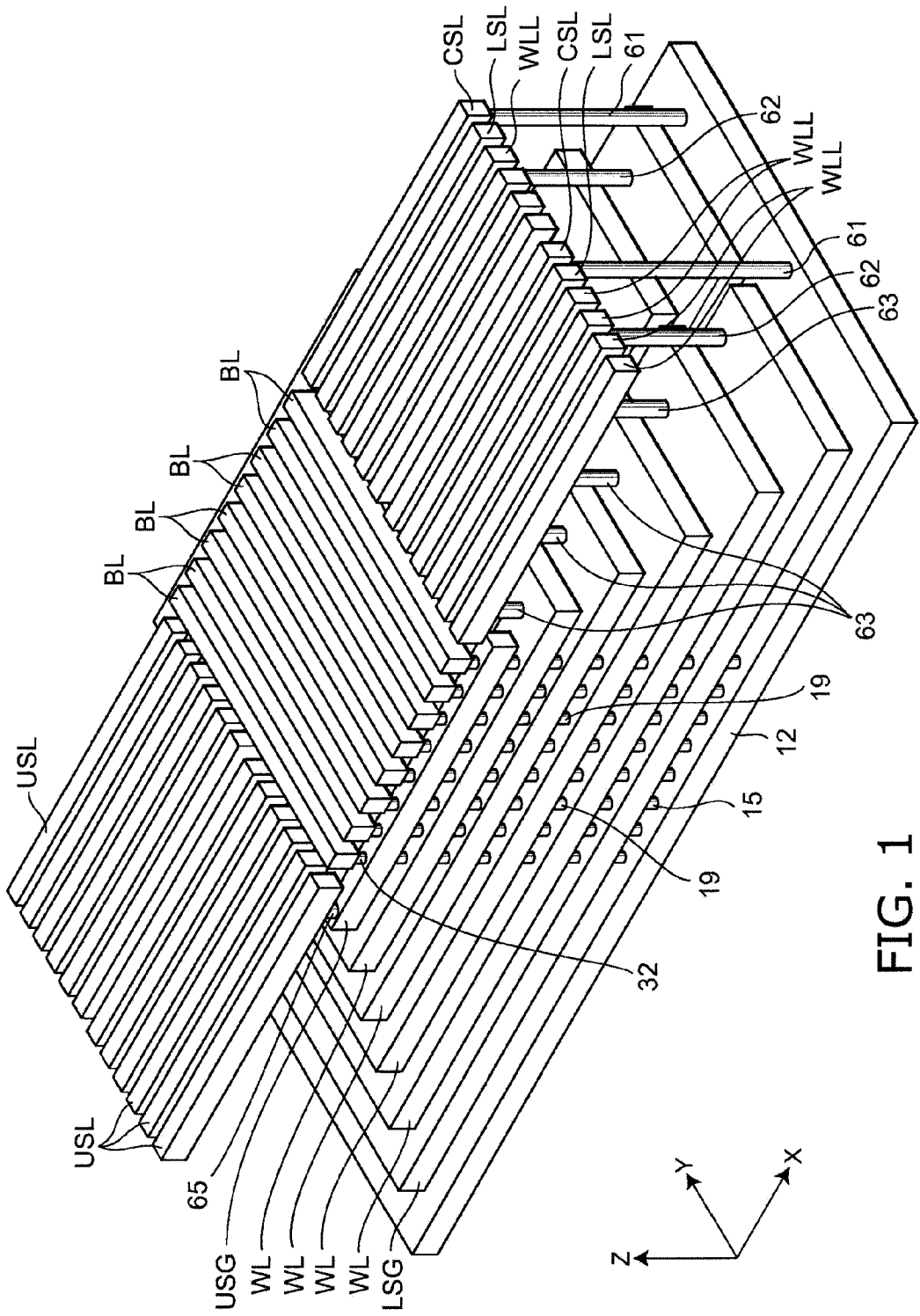
FIG. 1 is a schematic perspective view illustrating a configuration of a memory cell array in a semiconductor device according to an embodiment of the invention.

FIG. 1 is a schematic perspective view illustrating a configuration of a memory cell array.

Figure 2:
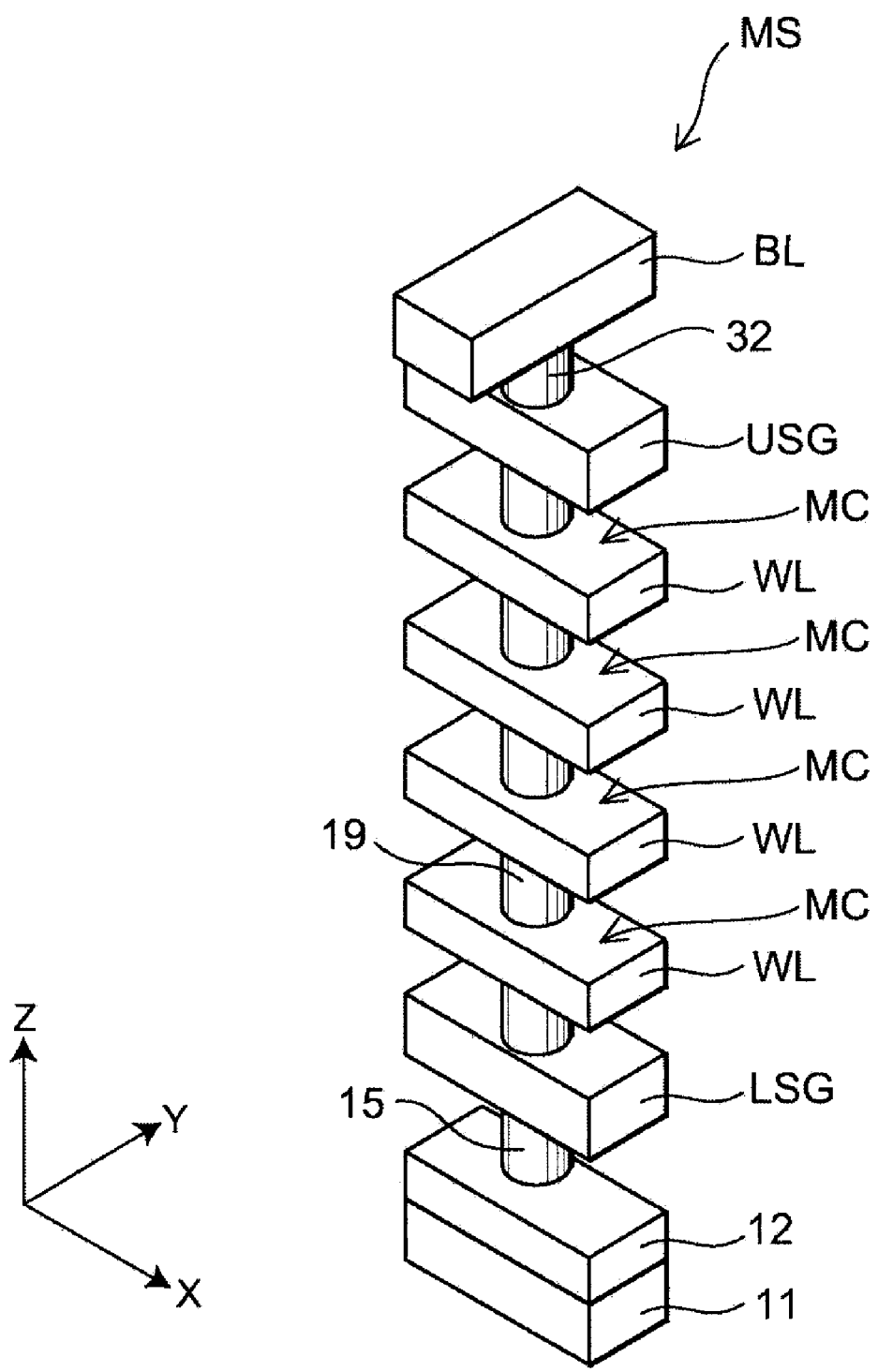
FIG. 2 is a schematic perspective view of one memory string in the memory cell array.

FIG. 2 is a schematic perspective view of one (one column) memory string that is configured by connecting a plurality of memory cells in series in the stacking direction of a plurality of conductive layers serving as word electrode layers.

Figure 3:
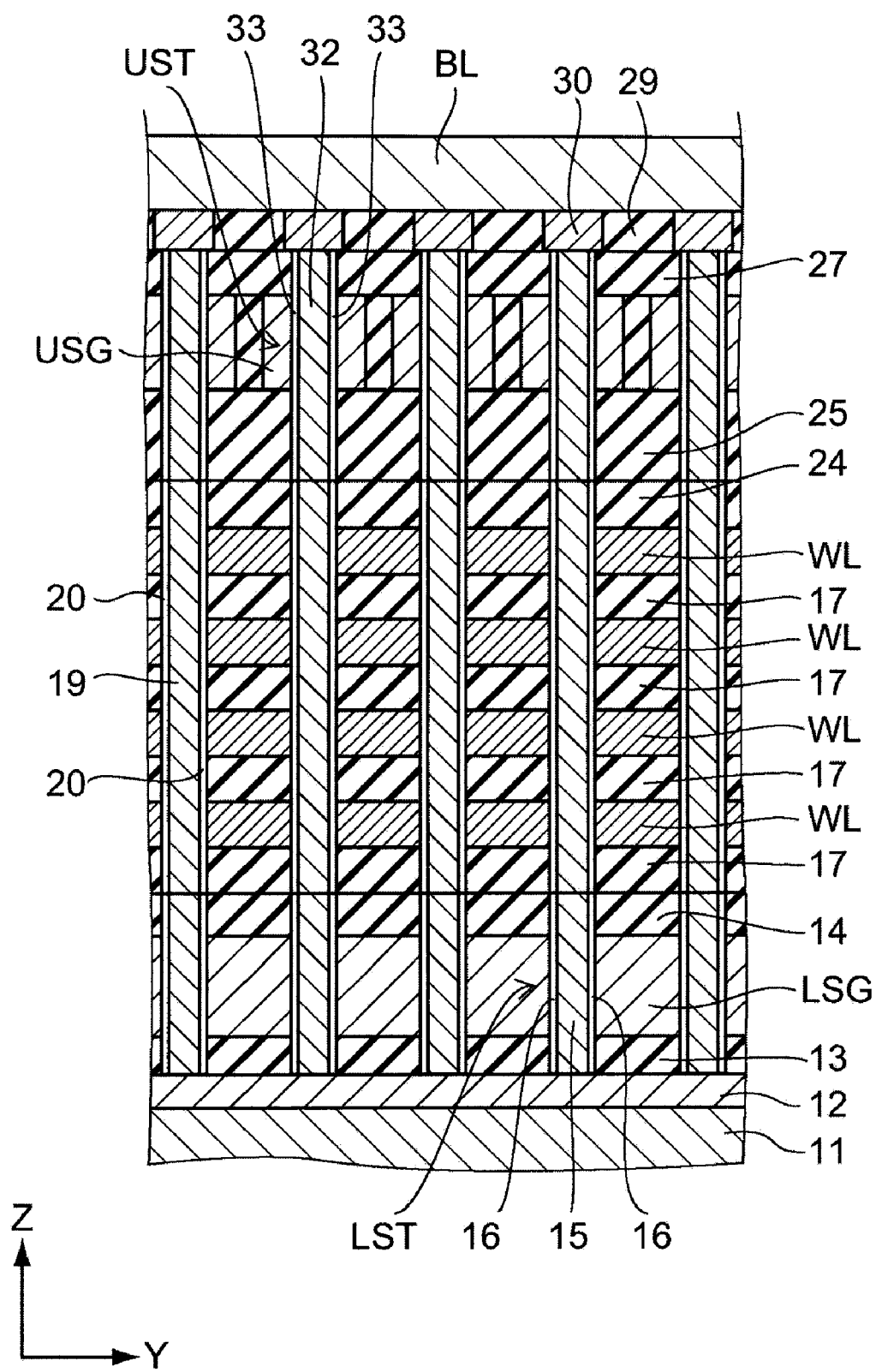
FIG. 3 is a schematic cross-sectional view illustrating the main part of the YZ direction in FIG. 1.

FIG. 3 is a schematic cross-sectional view of the main part of FIG. 1 in the YZ direction.

In FIG. 1 and FIG. 2, to facilitate visualization, only the conductive portions are illustrated, and illustration of the dielectric portions is omitted.

In this specification, for convenience of description, an XYZ orthogonal coordinate system is used. In this coordinate system, two directions parallel to the principal plane of the substrate and orthogonal to each other are defined as an X direction and a Y direction, and the direction orthogonal to both the X direction and the Y direction, that is, the stacking direction of conductive layers WL is defined as a Z direction.

As illustrated in FIG. 3, a cell source 12 is provided on a substrate (e.g. silicon substrate) 11. The cell source 12 is a silicon layer to which impurities are added and which has conductivity. A lower selection gate LSG is provided above the cell source 12 via a dielectric layer 13, and a dielectric layer 14 is provided on the lower selection gate LSG. The dielectric layers 13 and 14 are both layers including a silicon oxide and/or a silicon nitride, and the lower selection gate LSG is a silicon layer to which impurities are added and which has conductivity.

A stacked body in which a plurality of dielectric layers 17 and a plurality of conductive layers WL are alternately stacked is provided on the dielectric layer 14. The number of conductive layers WL is arbitrary, and in this embodiment, the case of four layers, for example, is illustrated. The dielectric layers 17 include a silicon oxide such as TEOS (tetraethoxysilane) $(Si(OC_2H_5)_4)$. The conductive layers WL are silicon layers to which impurities are added and which have conductivity.

A barrier layer (e.g. SiN layer) 24 is provided on the uppermost conductive layer WL; upper selection gates USG are provided above the barrier layer 24 via a dielectric layer 25; and a dielectric layer 27 is provided on the upper selection gates USG. The dielectric layers 25 and 27 are both layers including a silicon oxide and/or a silicon nitride, and the upper selection gate USG is a silicon layer to which impurities are added and which has conductivity.

As illustrated in FIG. 1, the conductive layers WL, the lower selection gate LSG, and the cell source 12 are formed in a plate-like shape parallel to the XY plane. The upper selection gates USG are conductive members shaped like a plurality of wirings extending in the X direction. The lower selection gate LSG may have a configuration of being divided into a plurality of members, like the upper selection gates USG.

A plurality of holes extending in the Z direction are formed in the stacked body above the substrate 11 described above. These holes are arranged in a matrix form along the X and Y directions, for example.

Silicon pillars 15, 19, and 32 are buried in each hole sequentially from the lower-layer side as columnar semiconductor layers. The silicon pillar 15 penetrates through the lower selection gate LSG; the silicon pillar 19 penetrates through the plurality of conductive layers WL; and the silicon pillar 32 penetrates through the upper selection gate USG. The silicon pillars 15, 19, and 32 are formed of polycrystalline silicon or amorphous silicon. The silicon pillars 15, 19, and 32 have a columnar shape such as a cylindrical shape extending in the Z direction. The lower end of the silicon pillar 15 is connected to the cell source 12. The lower end of the silicon pillar 19 is connected to the silicon pillar 15, and the upper end thereof is connected to the silicon pillar 32.

A dielectric layer 29 is provided on the dielectric layer 27 on the upper selection gates USG as illustrated in FIG. 3, and a plurality of bit lines BL extending in the Y direction are provided on the dielectric layer 29. Each bit line BL is arranged to pass immediately above the silicon pillars 32 that are arranged along the Y direction in each column, and each bit line BL is connected to the upper ends of the silicon pillars 32 via conductive connections 30 that are provided to penetrate through the dielectric layer 29.

As illustrated in FIG. 1, the upper selection gate USG is connected to an upper selection gate wiring USL via a conductive connection 65. The end of the stacked body in which the cell source 12, the lower selection gate LSG, and the plurality of conductive layers WL are stacked is patterned into a staircase shape. At this portion, the cell source 12 is connected to a cell source wiring CSL via a conductive connection 61; the lower selection gate LSG is connected to a lower selection gate wiring LSL via a conductive connection 62; and each conductive layer WL is connected to each word line WLL via each conductive connection 63.

Figure 4:
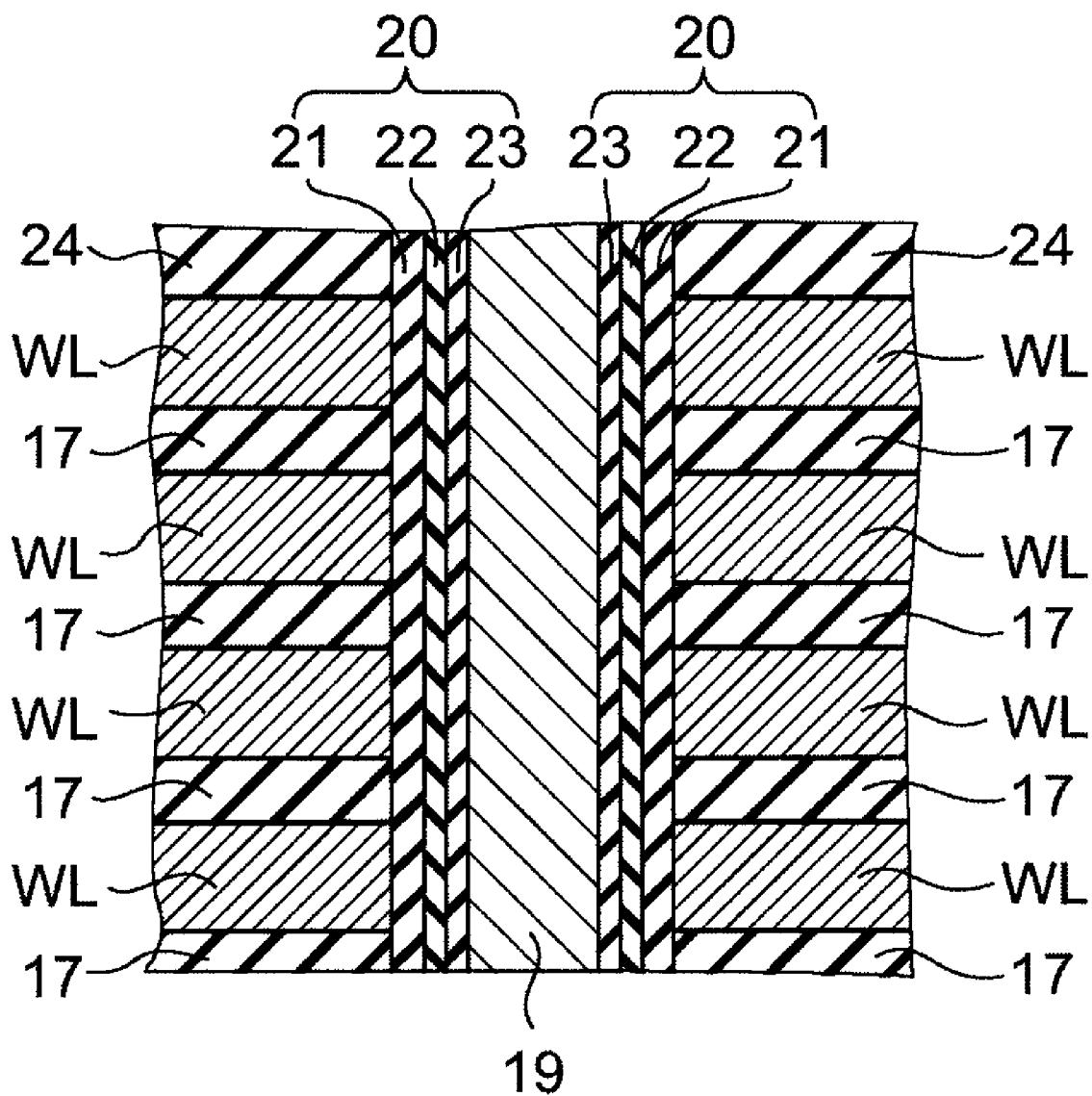
FIG. 4 is a schematic enlarged cross-sectional view of the portion in FIG. 3.

As illustrated in FIG. 3, a dielectric film 20 having an ONO (oxide-nitride-oxide) structure in which a silicon nitride film is placed between silicon oxide films, for example, is formed on the inner peripheral wall of the holes that are formed in the stacked body of the conductive layers WL and the dielectric layers 17. An enlarged cross-section of this portion is illustrated in FIG. 4.

The dielectric film 20 has a configuration in which a charge storage layer 22 is placed between a first dielectric film 21 and a second dielectric film 23. The silicon pillar 19 is provided on the inner side of the second dielectric film 23, and the second dielectric film 23 is in contact with the silicon pillar 19. The first dielectric film 21 is provided in contact with the conductive layers WL, and the charge storage layer 22 is provided between the first dielectric film 21 and the second dielectric film 23.

The silicon pillar 19 provided in the stacked body of the conductive layers WL and the dielectric layers 17 functions as a channel; the conductive layer WL functions as a control gate; and the charge storage layer 22 functions as a data memory layer that stores a charge injected from the silicon pillar 19. That is, a memory cell having a configuration in which a gate electrode surrounds the channel is formed at the intersection of the silicon pillar 19 and each of the conductive layers WL.

This memory cell is a memory cell of a charge trap structure. The charge storage layer 22 includes a large number of traps that confine a charge (electron) and is made of a silicon nitride film, for example. The second dielectric film 23 is made of, for example, a silicon oxide film and serves as a potential barrier when charges are injected from the silicon pillar 19 to the charge storage layer 22 or when charges stored in the charge storage layer 22 diffuse into the silicon pillar 19. The first dielectric film 21 is made of, for example, a silicon oxide film and prevents charges stored in the charge storage layer 22 from diffusing into the conductive layers WL.

As illustrated in FIG. 2, the same number of memory cells MC as conductive layers WL are connected in series in the Z direction around one silicon pillar 19, and one memory string MS is configured. Such memory strings MS are arranged in a matrix form in the X and Y directions. Thereby, a plurality of memory cells MC are arranged three-dimensionally in the X, Y, and Z directions.

As again referred to FIG. 3, a gate dielectric film 16 is formed in a tubular shape on the inner peripheral wall of the holes that are formed in a stacked body composed of the lower selection gate LSG and the dielectric layers 13 and 14 placed therebelow and thereabove, respectively; and the silicon pillar 15 is buried inside the gate dielectric film 16. Thereby, lower selection transistors LST, each of which has the silicon pillar 15 as a channel and the lower selection gate LSG placed therearound as a gate electrode, are provided in the stacked body.

Further, a gate dielectric film 33 is formed in a tubular shape on the inner peripheral wall of the holes that are formed in a stacked body composed of the upper selection gates USG and the dielectric layers 25 and 27 placed therebelow and thereabove, respectively; and the silicon pillar 32 is buried inside the gate dielectric film 33. Thereby, upper selection transistors UST, each of which has the silicon pillar 32 as a channel and the upper selection gate USG placed therearound as a gate electrode, are provided in the stacked body.

A not-illustrated peripheral circuit is formed on the same substrate 11 around the memory cell array described above. The peripheral circuit includes: a driver circuit that applies a potential to the upper end of silicon pillars 32 via bit lines BL; a driver circuit that applies a potential to the lower end of silicon pillars 15 via cell source wirings CSL and the cell source 12; a driver circuit that applies a potential to upper selection gates USG via upper selection gate wirings USL; a driver circuit that applies a potential to lower selection gates LSG via lower selection gate wirings LSL; a driver circuit that applies a potential to each electrode layer WL via each word line WLL; and the like.

The semiconductor device according to this embodiment can freely erase and write data electrically, and is a nonvolatile semiconductor memory device that can hold memory contents even if the power cuts off.

By selecting a bit line BL, the X-coordinate of a memory cell is selected. By selecting an upper selection gate USG to make the upper selection transistor UST in a conductive or nonconductive state, the Y-coordinate of the memory cell is selected. By selecting a word line WLL, that is, a conductive layer WL, the Z-coordinate of the memory cell is selected. Then, data is stored by injecting electrons to the charge storage layer 22 of the selected memory cell. Further, the data stored in the memory cell is read out by sending a sense current to the silicon pillar 19 that passes through the memory cell.

Next, a method for manufacturing a semiconductor device according to this embodiment will now be described with reference to FIG. 5A to FIG. 9B.

Figure 5A:
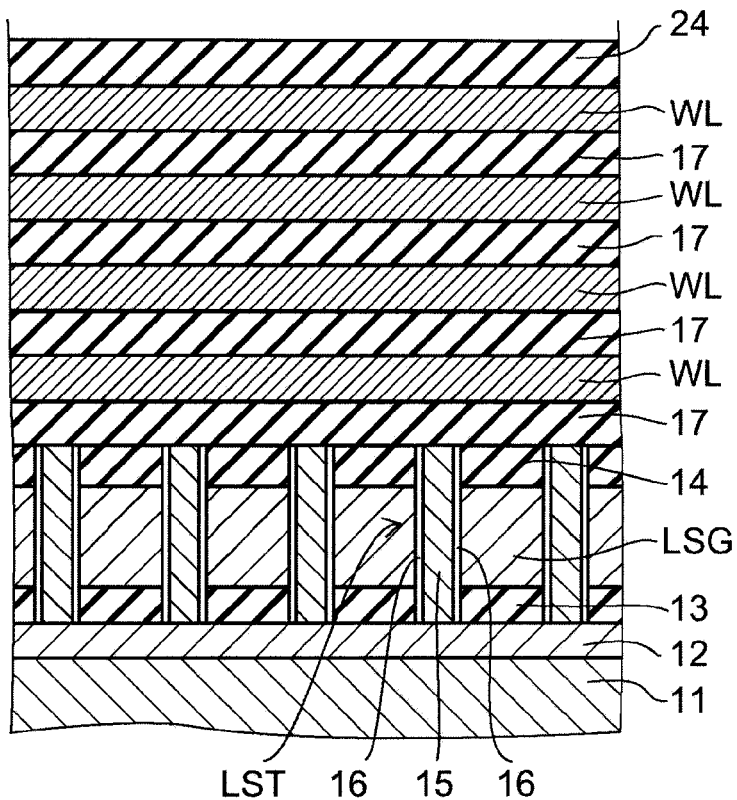
FIGS. 5A and 5B are schematic perspective views illustrating a method for manufacturing a semiconductor device according to the embodiment of the invention.

First, as illustrated in FIG. 5A, after a cell source 12 is formed on a substrate 11, a silicon layer that forms a lower selection gate LSG is formed above the cell source 12 via a dielectric layer 13, and a dielectric layer 14 is formed on the lower selection gate LSG. In the stacked body thus obtained, through-holes that reach the cell source 12 are formed by RIE (reactive ion etching), and then a gate dielectric film 16 is formed on the side walls of the through-holes, after which silicon pillars 15 are buried. Thereby, lower selection transistors LST are formed.

Figure 5B:
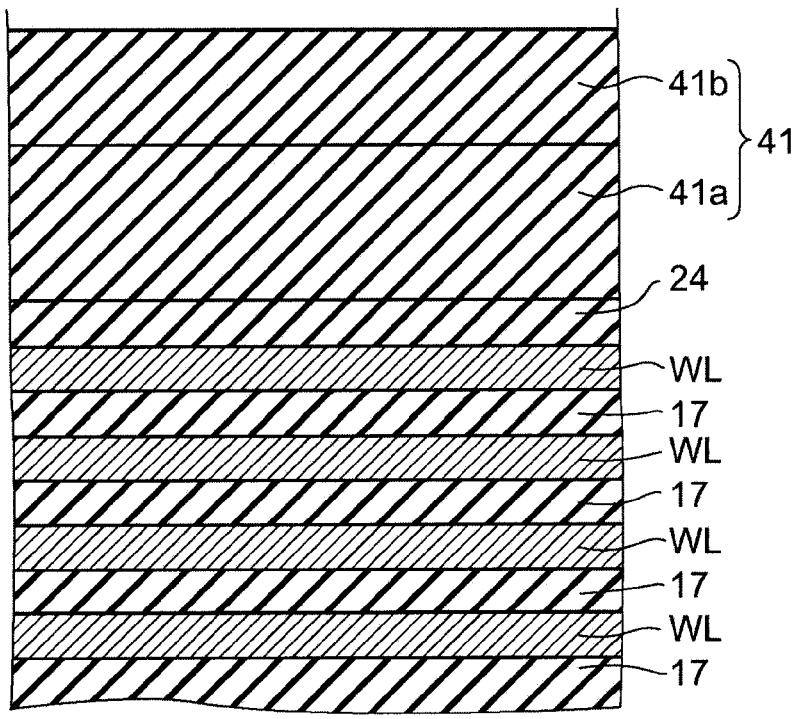

Next, a plurality of dielectric layers 17 and a plurality of conductive layers WL are alternately stacked on the dielectric layer 14, and a barrier layer 24 is formed on the uppermost layer of the stacked layers. Then, a first mask layer 41 is formed on the stacked body of these layers, as illustrated in FIG. 5B.

The first mask layer 41 includes: a first silicon oxide layer 41a that is formed on the barrier layer 24; and a second silicon oxide layer 41b that is formed on the first silicon oxide layer 41a. For example, the first silicon oxide layer 41a is a layer containing TEOS (tetraethoxysilane) ($Si(OC_2H_5)_4$), and the second oxide layer 41b is a layer including BSG (boron-silicate glass), which is $SiO_2$ including boron (B).

Figure 6A:
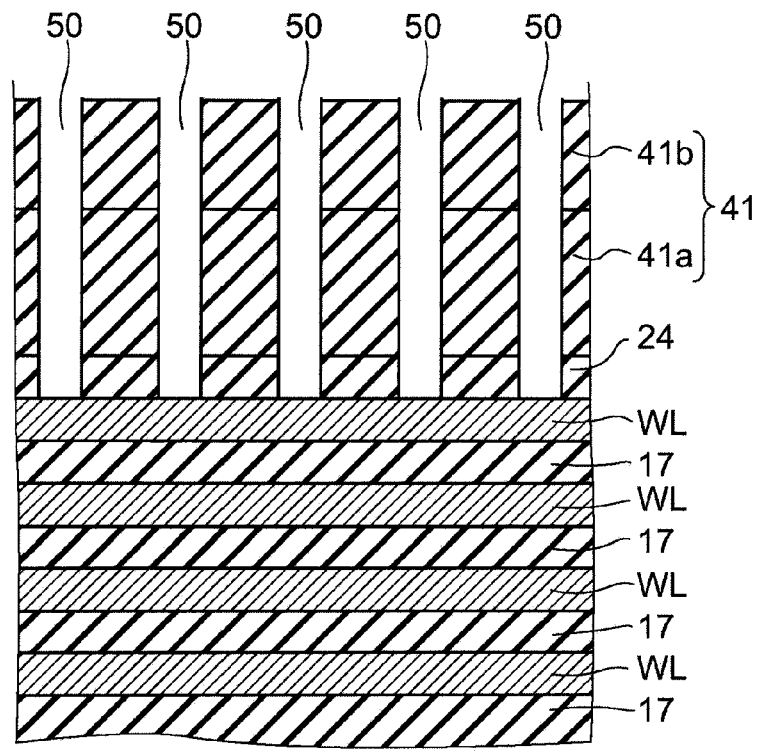
FIGS. 6A and 6B are schematic views in order of the steps, continuing from FIG. 5B.

The first mask layer 41 and the barrier layer 24 are patterned as illustrated in FIG. 6A. That is, RIE is performed on the first mask layer 41 and the barrier layer 24 while using a not-illustrated resist mask to form a plurality of holes 50. The planar layout of the plurality of holes 50 corresponds to the planar layout of memory strings, and is matrix-shaped, for example.

In the following of this specification, the n-th (n is a natural number) conductive layer WL indicates the n-th layer from the top out of the plurality of conductive layers WL. Likewise, the n-th dielectric layer 17 indicates the n-th layer from the top out of the plurality of dielectric layers 17.

Figure 6B:
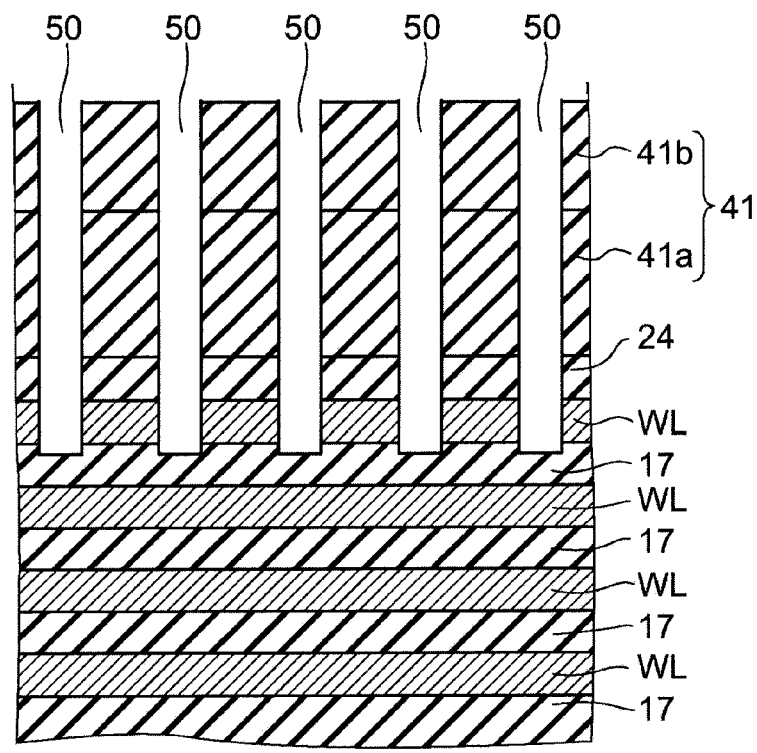

By forming the holes 50, the surface of the 1st conductive layer WL is exposed at the bottom of the holes 50. In this state, RIE is performed on the 1st conductive layer WL. As illustrated in FIG. 6B, holes that communicate with the upper holes 50, penetrate the film-thickness direction, and reach the underlying 1st dielectric layer 17 are formed in the 1st conductive layer WL.

Specifically, a wafer in which the stacked body described above is formed is held at a wafer holding section in a chamber while electrostatically chucked, for example, and the chamber interior is caused to be under a desired reduced-pressure atmosphere of desired gas. In these conditions, the gas in the chamber is excited to generate plasma. For example, in this embodiment, high-frequency power is applied to a TCP (transformer coupled plasma) electrode provided outside the chamber to generate electromagnetic waves, and the electromagnetic waves are introduced into the chamber to excite the gas in the chamber to transform the gas into plasma.

For example, $SiCl_4$ gas, HBr gas, $O_2$ gas, and $CF_4$ gas are introduced into the chamber at flow rates of 10 sccm, 150 sccm, 10 sccm, and 10 sccm, respectively, and the pressure in the chamber due to these gases is maintained at 30 mTorr. A high-frequency power of 480 W is applied to the TCP electrode. The wafer holding section also functions as an electrode, and a high-frequency power of 600 W is applied to this wafer holding section. The wafer is temperature-controlled at 60° C. by a temperature control mechanism such as a heater provided at the wafer holding section.

Under such conditions above, RIE is performed on the 1st conductive layer WL while using the first mask layer 41 as a mask. At this time, since the conductive layer WL, which is a silicon layer, has a sufficient etching selection ratio to the first mask layer 41 of silicon oxide type, the etching amount of the first mask layer 41 can be suppressed. When the etching selection ratio of the conductive layer WL to the first mask layer 41 is X, the etching amount of the first mask layer 41 is 1/X of that of the conductive layer WL.

Figure 7A:
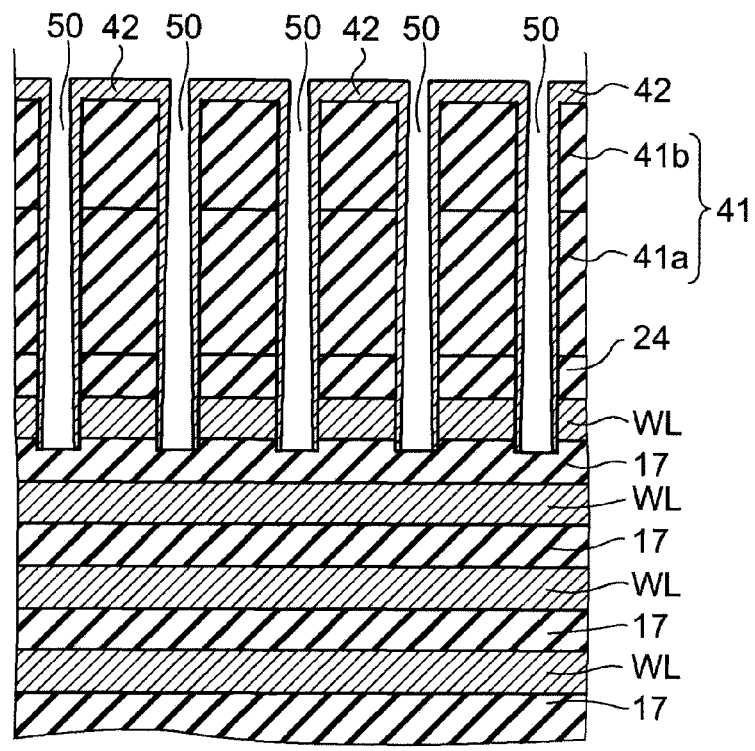
FIGS. 7A and 7B are schematic views in order of the steps, continuing from FIG. 6B.

Next, as illustrated in FIG. 7A, a second mask layer 42 is formed on the first mask layer 41. Specifically, the second mask layer 42 is deposited on the surface of the first mask layer 41 by plasma CVD (chemical vapor deposition), for example.

The formation of the second mask layer 42 is performed continuously in the same chamber as at the time of the etching of the conductive layer WL mentioned above, while changing conditions such as the type of gas to be introduced and the power applied to the electrode. Specifically, $SiCl_4$ gas and $H_2$ gas are introduced into the chamber at flow rates of both 20 sccm, and the pressure in the chamber due to these gases is maintained at 10 mTorr. A high-frequency power of 750 W is applied to the TCP electrode. No high-frequency power is applied to the wafer holding section. Further, the wafer is temperature-controlled at 60° C. When film formation is preformed for five seconds under such conditions, the substance to be deposited is hardly supplied to the bottom of the holes 50, and the second mask layer 42 is formed solely on the surface of the first mask layer 41. The second mask layer 42 is formed also on the side walls of the holes 50. The film thickness of the second mask layer 42 formed on the side wall of the hole 50 tends to thicken as coming close to the upper side near the opening end of the hole 50.

Next, the 1st dielectric layer 17 is etched while using the second mask layer 42 as a mask. This etching of the dielectric layer 17 is also performed continuously in the same chamber mentioned above, while changing conditions such as the type of gas to be introduced and the power applied to the electrode.

For example, $CHF_3$ gas and He gas are introduced into the chamber at flow rates of 100 sccm and 200 sccm, respectively, and the pressure in the chamber due to these gases is maintained at 8 mTorr. A high-frequency power of 600 W is applied to the TCP electrode. A high-frequency power of 300 W is applied to the wafer holding section. The wafer is temperature-controlled at 60° C.

Figure 7B:
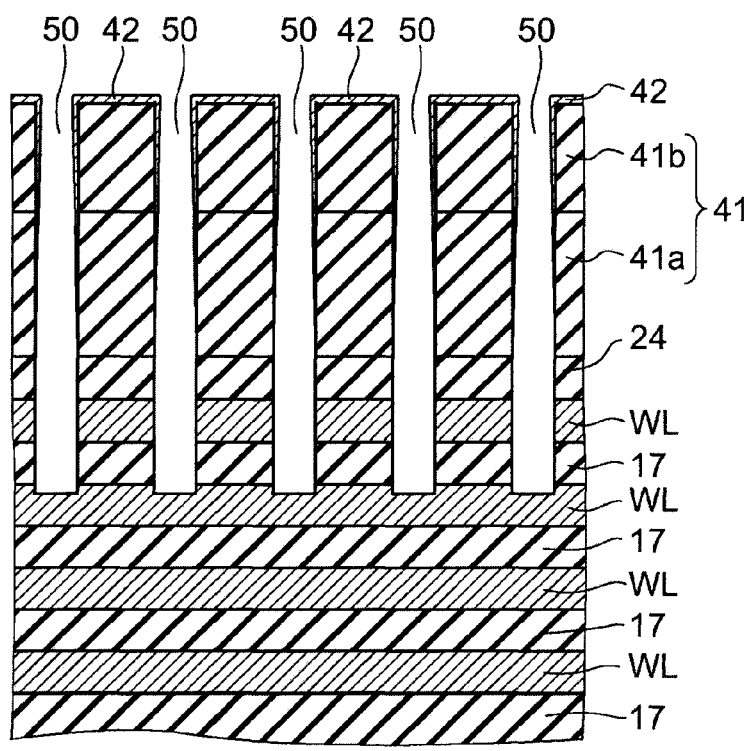

As illustrated in FIG. 7B, holes that penetrate through the 1st dielectric layer 17 are formed by this RIE. Since the second mask layer 42 is a silicon-rich layer that has more silicon content than the dielectric layer 17 of silicon oxide type and the dielectric layer 17 has a sufficient etching selection ratio to the second mask layer 42, the etching amount of the second mask layer 42 can be suppressed. As a result, the etching amount of the underlying first mask layer 41 can be also suppressed.

Figure 8A:
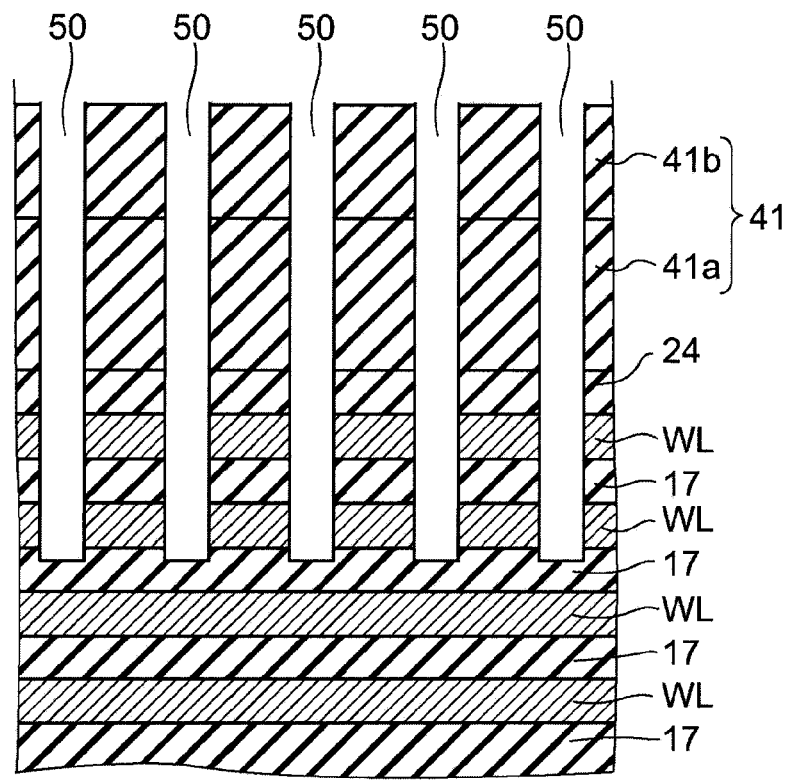
FIGS. 8A and 8B are schematic views in order of the steps, continuing from FIG. 7B.

Next, RIE of the 2nd conductive layer WL is performed in the same chamber. The conditions at this time are similar to those for the RIE of the 1st conductive layer WL. That is, $SiCl_4$ gas, HBr gas, $O_2$ gas, and $CF_4$ gas are introduced into the chamber at flow rates of 10 sccm, 150 sccm, 10 sccm, and 10 sccm, respectively, and the pressure in the chamber due to these gases is maintained at 30 mTorr. A high-frequency power of 480 W is applied to the TCP electrode. A high-frequency power of 600 W is applied to the wafer holding section. The wafer is temperature-controlled at 60° C. As illustrated in FIG. 8A, holes that penetrate through the 2nd conductive layer WL are formed by this RIE.

At this time, both the second mask layer 42 and the conductive layer WL are made of same silicon-based material, and the second mask layer 42 is also etched as much as the conductive layer WL. The second mask layer 42 is formed with a thickness less than the thickness of one conductive layer WL; therefore, all or most of the second mask layer 42, including portions formed on the side wall of the holes 50, is removed during the RIE of the conductive layer WL. However, since the conductive layer WL has a sufficient etching selection ratio to the first mask layer 41, the first mask layer 41 can be used as a mask to form holes that penetrate through the 2nd conductive layer WL. At this time, the etching amount of the first mask layer 41 can be suppressed. That is, the first mask layer 41 once formed can be used commonly as a mask layer for the RIE of each conductive layer WL.

Figure 8B:
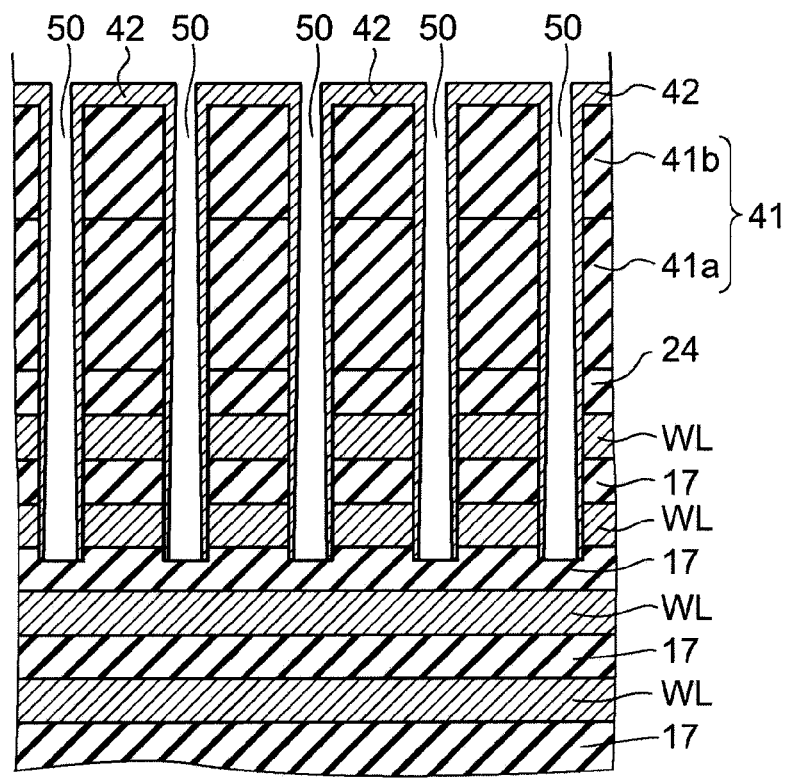

All or most of the second mask layer 42 formed in the previous step has been removed by the RIE of the 2nd conductive layer WL when performing the RIE of the 2nd insulating layer 17, thus, the second mask layer 42 is again formed on the first mask layer 41, as illustrated in FIG. 8B.

This is film-formed by plasma CVD under conditions similar to those for the formation of the second mask layer 42 described above. The second mask layer 42 is formed continuously in the same chamber after the RIE of the 2nd conductive layer WL.

For example, $SiCl_4$ gas and $H_2$ gas are introduced into the chamber at flow rates of both 20 sccm, and the pressure in the chamber due to these gases is maintained at 10 mTorr. A high-frequency power of 750 W is applied to the TCP electrode. No high-frequency power is applied to the wafer holding section. The wafer is temperature-controlled at 60° C. At this time also, the second mask layer 42 is hardly formed at the bottom of the holes 50 but is formed on the surface of the first mask layer 41 and on the side walls of the holes 50.

Figure 9A:
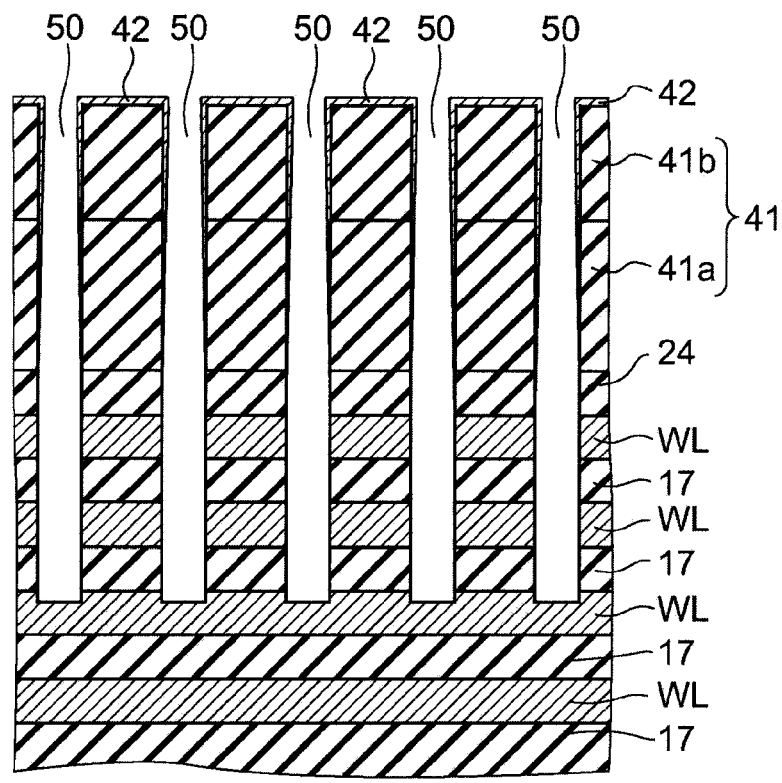
FIGS. 9A and 9B are schematic views in order of the steps, continuing from FIG. 8B.

After the second mask layer 42 is thus again formed on the first mask layer 41, the 2nd dielectric layer 17 is etched while using the second mask layer 42 as a mask as illustrated in FIG. 9A. The etching of this dielectric layer 17 is also performed continuously in the same chamber mentioned above, while changing conditions such as the type of gas to be introduced and the power applied to the electrode.

For example, $CHF_3$ gas and He gas are introduced into the chamber at flow rates of 100 sccm and 200 sccm, respectively, and the pressure in the chamber due to these gases is maintained at 8 mTorr. A high-frequency power of 600 W is applied to the TCP electrode. A high-frequency power of 300 W is applied to the wafer holding section. The wafer is temperature-controlled at 60° C.

Holes that penetrate through the 2nd dielectric layer 17 are formed by this RIE. At this time also, since the second mask layer 42 is a silicon-rich layer that has more silicon content than the dielectric layer 17 of silicon oxide type and the dielectric layer 17 has a sufficient etching selection ratio to the second mask layer 42, the etching amount of the second mask layer 42 can be suppressed. As a result, the etching amount of the underlying first mask layer 41 can be also suppressed.

Figure 9B:
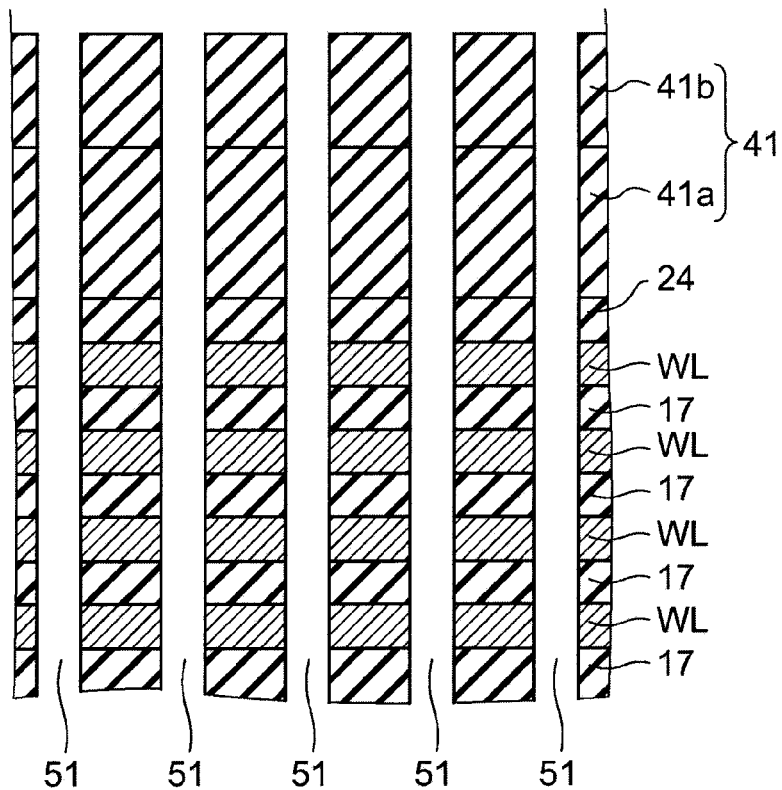

By alternately repeating the RIE of the conductive layer WL and the RIE of the dielectric layer 17 after forming the second mask layer 42 described above for the 3rd and subsequent layers, memory holes 51 that penetrate through the plurality of conductive layers WL and the plurality of dielectric layers 17 are formed, as illustrated in FIG. 9B.

A series of steps of repeating the RIE of each conductive layer WL, the formation of the second mask layer 42, and the RIE of each dielectric layer 17 are collectively performed in the same chamber while changing processing conditions such as the type of gas to be introduced and the power applied to the electrode for each step. Therefore, the wafer does not need to be moved among chambers for each step and efficient processing can be implemented.

In this embodiment, each conductive layer WL undergoes RIE while using the first mask layer 41 as a mask. Since the conductive layer WL, which is a silicon layer, has a sufficient etching selection ratio to the first mask layer 41 of silicon oxide type, the etching amount of the first mask layer 41 can be suppressed.

On the other hand, each dielectric layer 17 undergoes RIE while using the second mask layer 42, which is formed on the first mask layer 41, as a mask. Since the dielectric layer 17 of silicon oxide type has a sufficient etching selection ratio to the second mask layer 42, which is more silicon-rich than the dielectric layer 17, the etching amount of the second mask layer 42 can be suppressed. As a result, the etching amount of the underlying first mask layer 41 can be suppressed.

The first mask layer 41 functions as a common mask layer throughout the series of steps described above. Since the etching amount of the first mask layer 41 can be suppressed at the time of both the RIE of each conductive layer WL and the RIE of each dielectric layer 17, the first mask layer does not have to be formed so thick. Accordingly, particularly even in the case where the number of stacked conductive layers WL and dielectric layers 17 is large, the first mask layer 41 does not have to be made so thick, and the increase in the aspect ratio of the holes 50, which are to be formed as a pattern in the first mask layer 41, can be suppressed. This makes it possible to implement patterning on the first mask layer 41 with high accuracy.

Once the first mask layer 41 is formed, it remains until the formation of the memory holes 51 is completed. The first mask layer 41 is etched little by little during the RIE of each layer and becomes thinner. When the etching selection ratio of the conductive layer WL to the first mask layer 41 is X, the first mask layer 41 is also etched by an etching amount of 1/X of that of the conductive layer WL during the RIE of each conductive layer WL, and becomes thinner. Therefore, the first mask layer 41 is formed comparatively thick so that the first mask layer 41 may remain even at the time of the RIE of the lowermost conductive layer WL and the first mask layer 41 may not be lost during the RIE of the lowermost conductive layer WL.

In contrast, the second mask layer 42 that is formed each time before the RIE of the dielectric layer 17 is formed thinner than the first mask layer 41 from the viewpoint of shortening of each film-formation time. When the etching selection ratio of the dielectric layer 17 to the second mask layer 42 is Y, the second mask layer 42 is also etched by an etching amount of 1/Y of that of the dielectric layer 17 during the RIE of each dielectric layer 17 and becomes thinner. Furthermore, in the case where the second mask layer 42 is lost during the RIE of each dielectric layer 17, the first mask layer 41 is exposed.

The first mask layer 41 is of silicon oxide type like the dielectric layer 17, thus the first mask layer 41 is etched at a rate similar to that of the dielectric layer 17. However, the dielectric layer 17 has already been etched since the second mask layer 42 existed, and the remaining etching amount is estimated to be small. Accordingly, the etching amount of the first mask layer 41 at the time of the RIE of the dielectric layer 17 can be also suppressed to a low level.

Therefore, in this embodiment, even in the case where the number of stacked conductive layers WL and dielectric layers 17 is large, through-holes (the memory holes 51) can be formed collectively in a stacked body in which the conductive layers WL and the dielectric layers 17 of mutually-different materials are alternately stacked, while curbing the increase in the aspect ratio of the mask layer.

During the formation of the second mask layer 42, the second mask layer 42 is also formed on the side walls of the holes 50, as illustrated in FIG. 7A and FIG. 8B. That is, the side face of the first mask layer 41, which was exposed in the hole 50 before forming the second mask layer 42, comes to be covered with the second mask layer 42. Therefore, during the etching of the dielectric layer 17 of silicon oxide type similar to the type of the first mask layer 41, the side etching of the side face of the first mask layer 41 can be suppressed and the expansion of the hole diameter of the hole 50 can be suppressed. Thus, the dimensional variation of the holes 50 that form a mask pattern can be suppressed. As a result, memory holes can be formed with high accuracy and variation in device characteristics can be suppressed.

In this embodiment, when forming the second mask layer 42, fluorocarbon-based gas and/or $N_2$ gas may be introduced as gas added to $SiCl_4$ gas. In this case, a SiC-based or SiN-based layer is film-formed, which can be formed under the following conditions, for example.

$SiCl_4$ gas, HBr gas, $O_2$ gas, and $CF_4$ gas are introduced into the chamber at flow rates of 5 sccm, 150 sccm, 10 sccm, and 5 sccm, respectively, and the pressure in the chamber due to these gases is maintained at 30 mTorr. A high-frequency power of 480 W is applied to the TCP electrode, and no high-frequency power is applied to the wafer holding section. The wafer is temperature-controlled at 60° C. Under such conditions, film-formation is performed for 25 seconds to form the second mask layer 42.

The second mask layer 42 is a layer more silicon-rich than a layer of silicon oxide type such as TEOS and BSG, and the source gas used during the film-formation of the second mask layer 42 includes silicon (Si). $SiCl_4$ gas was used as this source gas including silicon, and the collective formation of the memory holes 51 described above was carried out successfully.

However, in the case where $SiCl_4$ gas is used, conductive layers WL particularly on the upper-layer side tend to be side-etched by Cl radicals generated by the plasma generation, and the diameter of the memory hole on the upper-layer side tends to be large. If the diameter of the memory hole is significantly different between on the upper-layer side and on the lower-layer side, there is concern that characteristics vary between memory cells of the upper-layer side and memory cells of the lower-layer side.

Accordingly, in the case where $SiCl_4$ gas is used as the source gas for forming the second mask layer 42, it is preferable that gas including hydrogen (H) (e.g. $H_2$ gas and HBr gas) is additionally used. That is, H combines with Cl to reduce the amount of existing Cl radicals, and thereby the etching of the conductive layer WL during the formation of the second mask layer 42 can be suppressed.

Further, during the formation of the second mask layer 42, it is preferable that the wafer holding section is grounded and no power is applied to it. This is because there is concern that bias electric field may be generated between the wafer and plasma by applying high-frequency power to the wafer holding section, and the electric field may accelerate ions and the like toward the wafer to undesirably etch the conductive layer WL and/or the dielectric layer 17.

The memory hole 51 described above is formed immediately above the silicon pillar 15 of the lower selection transistor LST of the underlying layers so as to reach the silicon pillar 15.

Then, after removing the first mask layer 41 and, if remaining, the second mask layer 42, the dielectric film 20 including the charge storage layer 22 described above is formed on the side wall of the memory hole 51 and then a silicon pillar 19 is buried therein. Thereby, the configuration illustrated in FIG. 3 is obtained. That is, a memory cell is formed at the intersection of the silicon pillar 19 and each conductive layer WL.

Next, a dielectric layer 25, a silicon layer that forms upper selection gates USG, and a dielectric layer 27 are formed on the barrier layer 24 one after another, and through-holes that reach the upper ends of the silicon pillars 19 of the underlying memory cells are formed by RIE in the stacked body of these newly-stacked layers. Then, a gate dielectric film 33 is formed on the side wall of the through-hole, and further a silicon pillar 32 is buried in the through-hole. Thereby, upper selection transistors UST are formed. After that, processes for forming wirings such as bit lines BL continue to be performed to obtain such a semiconductor memory device as illustrated in FIG. 1.

Hereinabove, embodiments of the invention are described with reference to specific examples. However, the invention is not limited to those examples but various modifications are possible based on the technical idea of the invention.

The silicon pillar is not limited to cylindrical but may be prismatic. Alternatively, the configuration is not limited to that in which all the portion inside the through-hole is filled with silicon, but a configuration may be used in which a silicon film is formed cylindrically only at portions in contact with the dielectric film that includes the charge storage layer and dielectric material is buried inside the silicon film. Furthermore, the dielectric film structure between the conductive layers and the silicon pillar is not limited to an ONO (oxide-nitride-oxide) structure, but may be a two-layer structure of a charge storage layer and a gate dielectric film, for example.

The invention claimed is:

1. A method for manufacturing a semiconductor device, comprising:
   forming a stacked body of a dielectric layer including a silicon oxide and a conductive layer including silicon above a substrate; and
   forming a hole penetrating through the dielectric layer and the conductive layer in the stacked body,
   the forming the hole including:
      forming a first mask layer including a silicon oxide above the stacked body;
      etching the conductive layer while using the first mask layer as a mask; and
      forming a second mask layer having more silicon content than the dielectric layer above the first mask layer to etch the dielectric layer while using the second mask layer as a mask,
   wherein a plurality of the dielectric layers and a plurality of the conductive layers are alternately stacked to form the stacked body, etching each of the conductive layers while commonly using the first mask layer formed above the stacked body before etching the dielectric layers and the conductive layers and etching each of the dielectric layers after forming the second mask layer above the first mask layer are alternately repeated to form the hole in the stacked body and forming a dielectric film including a charge storage layer on side wall of the hole after forming the hole; and providing a semiconductor layer in the hole after forming the dielectric film.

2. The method according to claim 1, wherein the first mask layer is made thicker than the second mask layer.

3. The method according to claim 1, wherein thickness of the second mask layer is made not more than thickness of one layer of the conductive layers.

4. The method according to claim 1, wherein the second mask layer is formed each time before etching each of the dielectric layers.

5. The method according to claim 1, wherein the first mask layer is formed thick enough to remain when etching lowermost layer of the conductive layers.

6. The method according to claim 1 further comprising forming a silicon nitride layer on the stacked body before forming the first mask layer, wherein the first mask layer is formed on the silicon nitride layer.

7. The method according to claim 1, wherein the first mask layer includes a first silicon oxide layer and a second silicon oxide layer of which materials are different from each other.

8. The method according to claim 1, wherein the second mask layer includes SiC.

9. The method according to claim 1, wherein the second mask layer includes SiN.

10. The method according to claim 1,
wherein the second mask layer is formed by plasma CVD (chemical vapor deposition).

11. The method according to claim 10, wherein the second mask layer is also formed on side wall of the hole in forming the hole.

12. The method according to claim 10, wherein source gas during the plasma CVD includes $SiCl_4$.

13. The method according to claim 12, wherein the source gas further includes hydrogen (H).

14. The method according to claim 10, wherein, during the plasma CVD, a substrate above which the stacked body is formed is held at a holding section in a chamber in which plasma is generated and the holding section is grounded.

15. The method according to claim 1, wherein, during etching of the conductive layer and during etching of the dielectric layer, a substrate above which the stacked body is formed is held at a holding section in a chamber in which plasma is generated and power is applied to the holding section.

16. The method according to claim 1, wherein etching of the conductive layer, formation of the second mask layer, and etching of the dielectric layer are performed continuously in the same chamber under a reduced-pressure atmosphere.

17. The method according to claim 1, wherein the forming the dielectric film includes:

forming a first dielectric film on side wall of the hole;

forming the charge storage layer inside the first dielectric film; and forming a second dielectric film inside the charge storage layer.

18. The method according to claim 1 further comprising:

forming a selection gate above the stacked body after providing the semiconductor layer in the hole;

forming a hole for a selection transistor reaching upper end of the semiconductor layer in the selection gate;

forming a gate dielectric film on side wall of the hole for the selection transistor; and providing a semiconductor layer for the selection transistor in the hole for the selection transistor after forming the gate dielectric film.

* * * * *